(12) United States Patent
Abbott et al.

(10) Patent No.: US 6,798,318 B1
(45) Date of Patent: Sep. 28, 2004

(54) HYBRID LEAKY SURFACE ACOUSTIC WAVE RESONATOR FILTER

(75) Inventors: Benjamin P. Abbott, Orlando, FL (US); Joshua J. Caron, Altamonte Springs, FL (US); Kamran S. Cheema, Apopka, FL (US)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 10/132,055

(22) Filed: Apr. 25, 2002

Related U.S. Application Data

(60) Provisional application No. 60/286,877, filed on Apr. 27, 2001, and provisional application No. 60/286,901, filed on Apr. 27, 2001.

(51) Int. Cl.[7] ............................................. H03H 9/64
(52) U.S. Cl. ..................... 333/195; 333/133; 310/313 D
(58) Field of Search ............................... 333/193–196, 333/132–134; 310/313 R, 313 A, 313 D, 311

(56) References Cited

U.S. PATENT DOCUMENTS

| | | | | |
|---|---|---|---|---|
| 5,499,003 A | * | 3/1996 | Davenport | .................. 333/195 |
| 5,610,566 A | | 3/1997 | Chen et al. | .................. 333/194 |
| 5,796,205 A | | 8/1998 | Nishihara et al. | ....... 310/313 R |
| 5,932,950 A | | 8/1999 | Yamada et al. | ......... 310/333 D |
| 5,936,483 A | * | 8/1999 | Ikada | ......................... 333/133 |
| 5,936,487 A | * | 8/1999 | Solal et al. | ................. 333/193 |
| 5,990,762 A | | 11/1999 | Nakamura et al. | ......... 333/195 |
| 6,104,260 A | | 8/2000 | Yamada et al. | ............. 333/193 |
| 6,208,224 B1 | * | 3/2001 | Taniguchi et al. | .......... 333/193 |
| 6,268,782 B1 | | 7/2001 | Hartmann et al. | .......... 333/193 |
| 6,317,015 B1 | | 11/2001 | Ueda et al. | .................. 333/193 |
| 6,380,827 B1 | * | 4/2002 | Noguchi | ..................... 333/193 |
| 6,501,208 B1 | | 12/2002 | Kuroda | ................... 310/313 R |
| 6,583,691 B2 | * | 6/2003 | Takamine | ................... 333/195 |
| 2002/0000898 A1 | | 1/2002 | Takamine | |

FOREIGN PATENT DOCUMENTS

DE            4212517         10/1993

* cited by examiner

*Primary Examiner*—Minh Nguyen
(74) *Attorney, Agent, or Firm*—Allen, Dyer, Doppelt, Milbrath & Gilchrist, P.A.

(57) ABSTRACT

A hybrid leaky surface acoustic wave (LSAW) resonator filter has a wide bandwidth, low insertion loss and return loss, and excellent rejection of frequencies outside the passband, and includes one or more longitudinally coupled LSAW resonator filter tracks with chirp-type resonant cavities, reflective gratings, and a plurality of interdigital transducers (IDTs) disposed end-to-end therebetween. An acoustic resonant cavity is formed between each of the IDTs and its neighboring IDTs or gratings by chirping the fingers of the IDTs in the vicinity of the cavity. A one or more LSAW impedance element filters are disposed upon the same substrate and connected in series and/or shunt with the longitudinally coupled LSAW resonator tracks. The frequencies of the LSAW impedance-element filters are chosen such that their combination with the longitudinally coupled LSAW resonator filter tracks results in the formation of deep nulls in the overall transfer function at frequencies just outside of the passband.

14 Claims, 12 Drawing Sheets

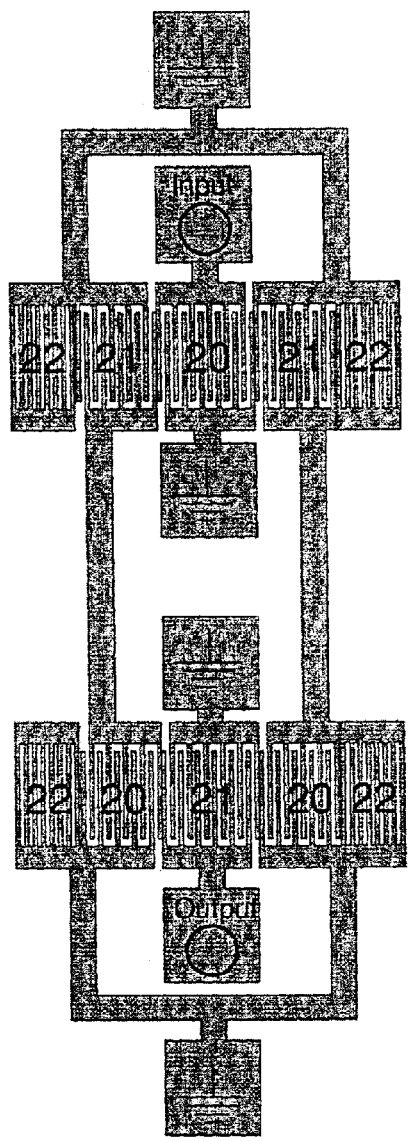
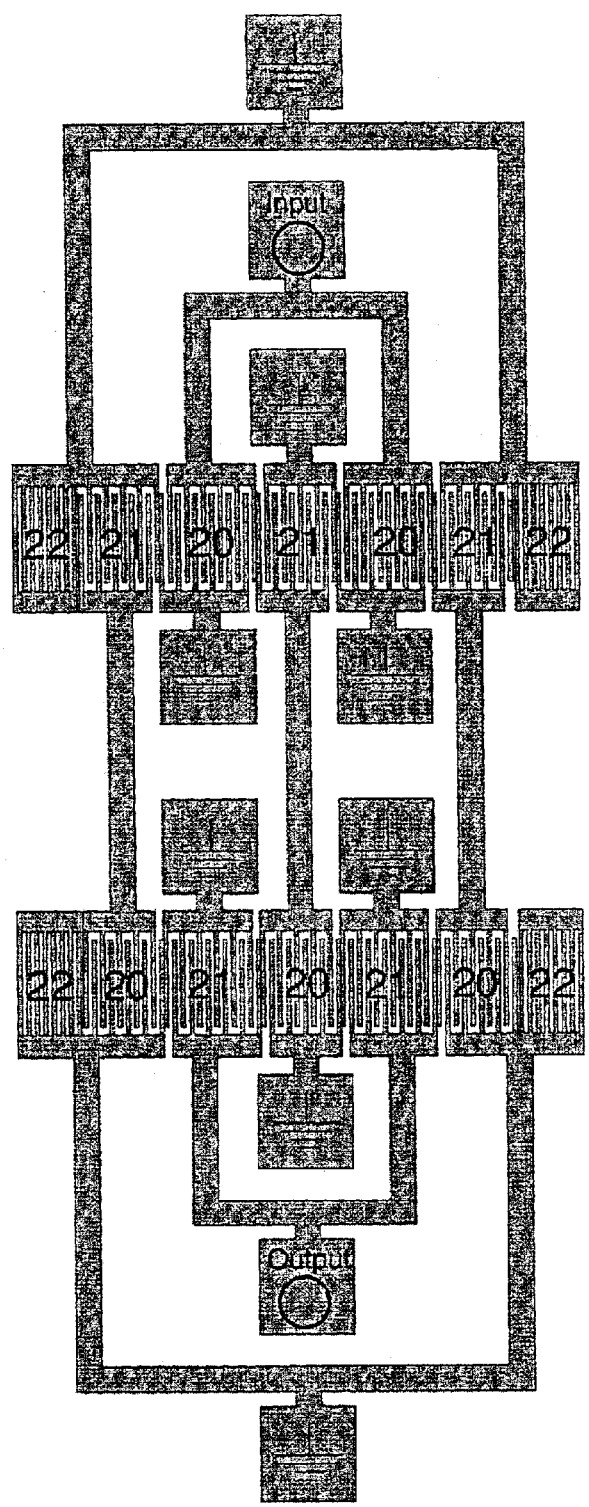
FIG. 2a
(Prior Art)
FIG. 2b
(Prior Art)

HYBRID LEAKY SURFACE ACOUSTIC WAVE RESONATOR FILTER

CROSS REFERENCE TO RELATED APPLICATIONS

This application incorporates by reference and claims priority to Provisional Application Ser. No. 60/286,877 for "Hybrid Leaky Surface Acoustic Wave Resonator Filter" having a filing date of Apr. 27, 2001 and incorporates the disclosure of Provisional application Ser. No. 60/286,901, filed Apr. 27, 2001 for "Longitudinally Coupled Leaky Surface Acoustic Wave Resonator Filter" by reference, all commonly owned with the instant application.

FIELD OF THE INVENTION

The present invention relates to a hybrid bandpass filter using a combination of a longitudinally coupled leaky surface acoustic wave (LSAW) resonator and a network of LSAW impedance-element filters, and more particularly, to a hybrid bandpass filter with improved performance which is manufacturable using standard fabrication techniques resulting from compatible metalization thicknesses of the coupled resonator and impedance-element components.

BACKGROUND OF THE INVENTION

As the telecommunications industry and society continue to push for mobile communications devices which are smaller, lighter, less expensive, and more energy efficient, the requirements for bandpass filters within these devices become increasingly stringent. Where once transversely coupled surface acoustic wave (SAW) resonator filters were widely used, high-performance transversal SAW filters or longitudinally coupled SAW or LSAW filters have begun to take their place. Transversal SAW filters have the advantages of high flexibility, wide bandwidth, and flat group delay time. However, with newer digital mobile communications protocols requiring smaller size and even less insertion loss, transversal filters simply cannot meet the requirements.

Longitudinally coupled LSAW resonator filters have shown much promise in meeting many of the application requirements because of their wide achievable bandwidth and low insertion loss. Conventional longitudinally coupled LSAW resonator filters typically consist of a plurality of LSAW resonator filter tracks connected in series. Each track generally includes a pair of reflective gratings, between which are disposed a plurality of interdigital transducers (IDTs). In each track, one or more non-adjacent IDTs act together to form a signal input for the track, and the remainder of the IDTs form an output. Adjacent tracks are connected together in series such that the output of the first track is connected to the input of the second, whose output is connected to the input of the third, etc. The input of the first track and the output of the last track comprise the electrical input and output of the bandpass filter. The most common configurations employ only two tracks with two, three, or five IDTs in each track. By way of example, FIG. 2a illustrates a schematic representation of a two-track longitudinally coupled LSAW resonator filter of the prior art with three IDTs per track, and FIG. 2b illustrates one with five IDTs per track. In both cases, the filters include two separate tracks, each with input IDTS 20, output IDTs 21, and gratings 22.

Good bandpass characteristics can be achieved with longitudinally coupled LSAW resonator filters by introducing resonant cavities between adjacent IDTs and between the gratings and the IDTs adjacent to them. As described in U.S. Pat. No. 5,485,052, the resonant cavities are introduced by inserting spacers between each IDT and its neighboring IDT or grating. The length of these spacers can be either positive (i.e. moving the IDTs/gratings further apart) or negative (i.e. moving the IDTs/gratings closer together). Spacers between adjacent IDTs are typically on the order of $\pm\lambda/4$, where $\lambda$ is the acoustic wavelength, and the spacers between the gratings and the adjacent IDTs is usually much smaller (e.g. $\pm\lambda/40$).

Although longitudinally coupled LSAW resonator filters exhibit good passband characteristics and strong rejection of frequencies substantially removed from the passband, they are typically plagued by inadequate rejection of frequencies close to the passband, especially those frequencies just above the passband. This renders them unusable in many applications requiring strong near-in rejection. FIG. 3 demonstrates this phenomenon.

Another technology used prolifically for mobile communications applications includes use of a "ladder" filter, the name of which comes from its architecture of repeated series-connected and shunt-connected impedance-element filters. Impedance-element filters are simple one-port resonators, as illustrated with reference to FIG. 4. They consist of a simple IDT 23 disposed between two reflective gratings 24. At the resonant frequency of one of these devices, the impedance is extremely low; at the anti-resonant frequency, on the other hand, the impedance is very high. By utilizing these devices as impedance elements in an electrical circuit, various filter characteristics can be achieved. The series connection of such a device acts as a crude low-pass filter with a deep notch corresponding to the anti-resonant frequency where the device's impedance substantially inhibits the signal from getting through. This Is shown as the thin line (Series) plotted in FIG. 5. The shunt connection of such a device, on the other hand, acts as a high-pass filter, with a deep notch corresponding to the resonant frequency, where the impedance is so low as to short much of the signal to ground. The frequency response in this configuration is plotted with the thick line (shunt) in FIG. 5. Hence, by repeated series-shunt combinations, or "ladders", as illustrated in FIG. 6a and shown schematically in FIG. 6b, bandpass filters can be realized with low insertion loss and excellent rejection of frequencies close to the pass band. However, ladder filters suffer from poor rejection of frequencies substantially removed from the passband, as demonstrated in the transfer function plot of FIG. 7.

The idea of combining longitudinally coupled LSAW resonator filters and LSAW impedance-element filters in order to achieve good near- and far-frequency rejection is not novel. An allusion to this combination can be found in U.S. Pat. No. 5,610,566. However, U.S. Pat. No. '566 fails to recognize that LSAW impedance-element filters require thick metalization in order to reap the benefits of high reflectivity and high piezoelectric coupling, thereby achieving a high Q. As will be herein described, this requirement renders LSAW impedance-element filters incompatible with conventional LSAW coupled resonator filters at the same relative metal thickness. FIG. 8a and FIG. 8b demonstrate the variation of the piezoelectric coupling coefficient, $K^2$, and the reflectivity, $\kappa$, as a function of aluminum metalization thickness on 42° Y-rotated lithium tantalate ($LiTaO_3$). On that substrate, impedance element filters require aluminum metalization thickness of at least 9% of the acoustic wavelength.

Conventional longitudinally coupled LSAW resonator filters, on the other hand, require a thinner metalization. This is because the velocity of the LSAW mode is in very close proximity to the slow shear bulk acoustic wave (BAW) mode. Whenever a discontinuity is encountered by the propagating LSAW, energy is reflected backwards and, due to the close proximity of the BAW, a significant portion of that energy can be converted into BAW energy and lost into the bulk of the substrate. This energy loss is commonly referred to as "radiation" or "scattering" loss. As reflectivity goes up, BAW radiation losses at the discontinuities go up as well. The spacer-type resonant cavities constitute significant phase discontinuities. Thus, conventional longitudinally coupled LSAW resonator filters are usually limited to metalization thicknesses of 8.5% or less. As thickness is increased above that value, losses due to BAW radiation outgrow the gains from increasing piezoelectric coupling and reflectivity.

Thus, in order to achieve a low-loss filter, the combination of the two aforementioned technologies would require different metalization thicknesses for the coupled resonators and the impedance-element filters, despite the suggestion otherwise by U.S. Pat. No. 5,610,566. This would require complicated fabrication steps, thus rendering the device unmanufacturable by reasonable standards. The present invention overcomes this problem by utilizing a novel longitudinally coupled LSAW resonator filter with chirp-type resonant cavities, rather than spacers. This structure exhibits significantly less BAW scattering and is, therefore, able to reasonably operate with a metalization thickness compatible with impedance-element filters. Heretofore, such a combination has never been proposed.

SUMMARY OF THE INVENTION

The present invention combines longitudinally coupled LSAW resonator filters with LSAW impedance element filters into a hybrid structure in order to achieve improved out-of-band rejection over either technology by itself. The problem of incompatible metalization thicknesses between the two technologies is overcome by utilizing a novel longitudinally coupled LSAW resonator filter architecture as described copending U.S. Patent Application titled "Longitudinally Coupled Leaky Surface Acoustic Wave Resonator Filter," claiming priority to Provisional Application serial No. 60/286,901 the disclosure of which is herein incorporated by reference. In this approach, the spacer-type resonant cavities of conventional longitudinally coupled LSAW resonator filters are replaced by "chirped" cavities, which are formed by assimilating the spacers into the first one half or more wavelengths of IDTs, as shown in FIG. 9. In so doing, the abrupt phase discontinuity of the spacer is eliminated, thereby significantly reducing the scattering of acoustic energy into BAWs in the cavity. Because of this, the metalization thickness can be increased substantially without excessive radiation loss. Metalization thickness equal to that ideal for the impedance-element filters is easily achievable.

This novel chirp-type longitudinally coupled LSAW resonator filter demonstrates little advantage over typical devices in the art in terms of near-frequency rejection. However, the structure has the distinct advantage that it can be formed on the same substrate along with impedance-element filters, both with the same metalization thickness. This hybrid device can then be fabricated in one photolithographic step, and the resultant filter exhibits much better rejection characteristics than either technology by itself.

By way of example, one embodiment of the present invention comprises first, second, and third IDTs disposed on a piezoelectric substrate and arranged in a surface wave propagating direction such that the second IDT is interposed between the first and the third IDTs, each of the first, second, and third IDTs having a plurality of electrode fingers. In this embodiment, the first and second IDTs have narrow electrode-finger pitch sections which have an electrode-finger pitch narrower than the remaining electrode-finger pitches, at respective end portions of the first and second IDTs, adjacent to each other. Likewise, the second and third IDTs have narrow electrode-finger pitch sections which have an electrode-finger pitch that is narrower than the remaining electrode-finger pitches, at respective end portions of the second and third IDTs, adjacent to each other. The electrode-finger pitch of the narrow electrode-finger pitch sections in the first and second IDTs are different from the electrode-finger pitch sections in the second and third IDTs. The respective narrow electrode-pitch sections also comprise different numbers of fingers with respect to each other. In this embodiment, the present invention further comprises at least one LSAW resonator connected in series or parallel to the longitudinally coupled resonator type LSAW filter.

BRIEF DESCRIPTION OF THE DRAWINGS

Preferred embodiments of the present invention are herein presented as well as others that will become more apparent by referring to the following detailed description and drawings in which:

FIG. 2a and FIG. 2b are schematic representations of a typical 3-IDT longitudinally coupled LSAW resonator filter and 5-IDT longitudinally coupled LSAW resonator filter, respectively, of the prior art;

DETAILED DESCRIPTION OF PREFERRED EMBODIMENTS

The present invention will now be described more fully with reference to the accompanying drawings in which preferred embodiments of the invention are shown and described. It is to be understood that the invention may be embodied in many different forms and should not be construed as limited to the illustrated embodiments set forth herein. Rather, the applicant provides these embodiments so that this disclosure will be thorough and complete, and will convey the scope of the invention to those skilled in the art.

Figure 1:
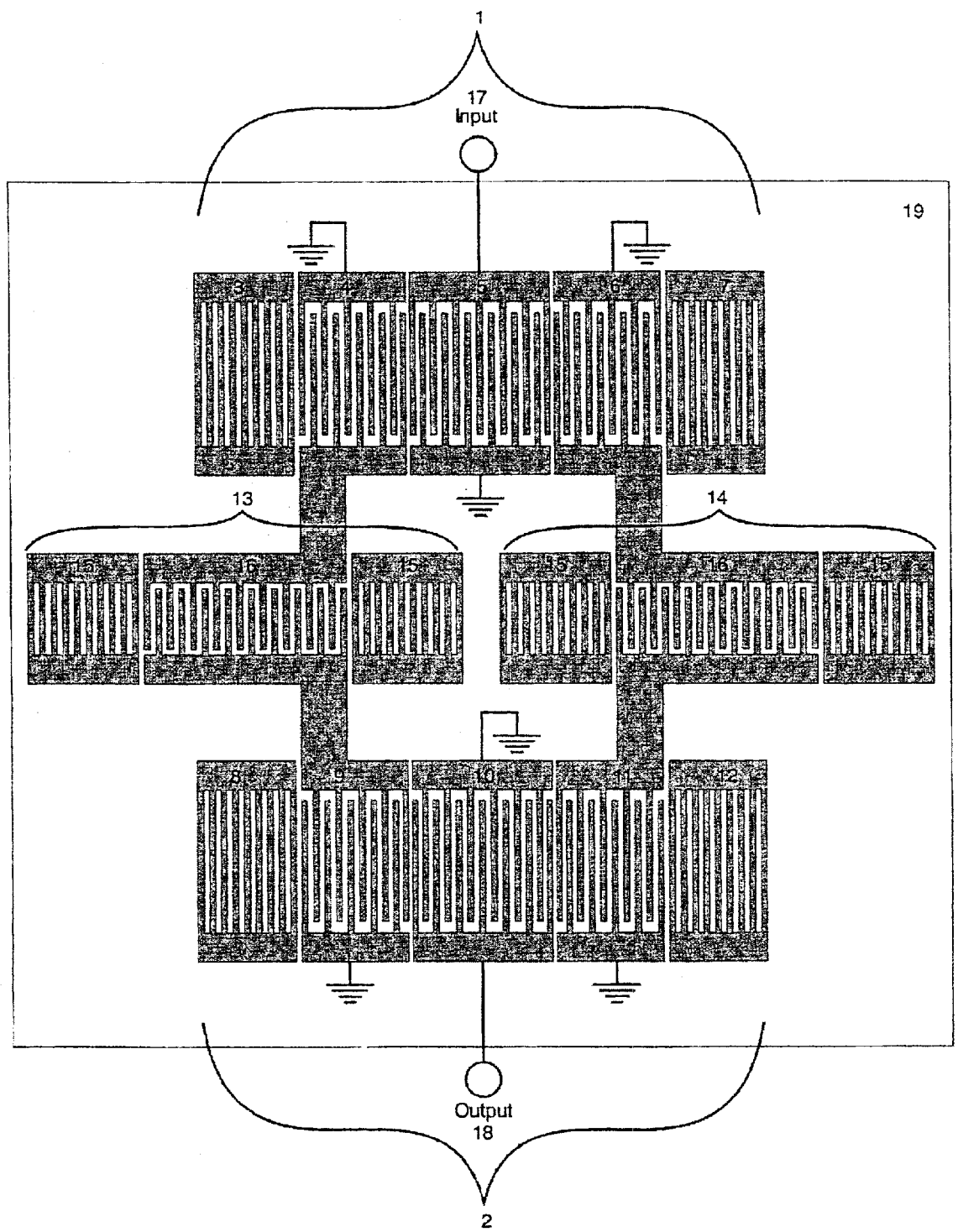
FIG. 1 is a schematic drawing of one preferred embodiment of the hybrid longitudinally coupled LSAW resonator filter of the present invention.

FIG. 1 is a schematic diagram of one preferred embodiment of the present invention. As illustrated, by way of example, the device includes two separate chirp-type LSAW resonator tracks 1 and 2, connected in series through a pair of impedance-element resonators 13 and 14. The first track 1 includes an input IDT 5, two output IDTs 4 and 6, and two reflective gratings 3 and 7. The second track 2 consists of two input IDTs 9 and 11, an output IDT 10, and two reflective gratings 8 and 12. The output IDTs of the first track 1 are connected in series to the input IDTs of the second track 2 through a pair of impedance-element resonators 13 and 14. Each impedance-element resonator is comprised of an IDT 16 disposed between a pair of reflective gratings 15. Because the impedance-element resonators are connected in series with the outputs of the first track 1 and the input of the second track 2, they act as low pass filters, and they are designed to add a null in the frequency response of the structure just above the passband. Electrical connections to the device consist of an input 17 connected to the upper bus bar of the input IDT 5 of the first track 1 and an output 18 connected to the lower bus bar of the output IDT 10 of the second track 2. The entire structure is disposed upon a piezoelectric substrate 19 of LiTaO$_3$ wherein the crystallographic orientation is such that the LSAW propagation direction is parallel to the X-axis, and the normal to the surface is within the range of 32° to 52° rotated from the Y-axis. The IDTs, gratings, and metal strips are comprised of aluminum or an aluminum alloy with a thickness within the range of 9% to 12% of the acoustic wavelength of the device. The ratio of the width of the fingers of the IDTs and gratings to the spaces between those fingers is within the range of 45:55 to 75:25.

Figure 9:
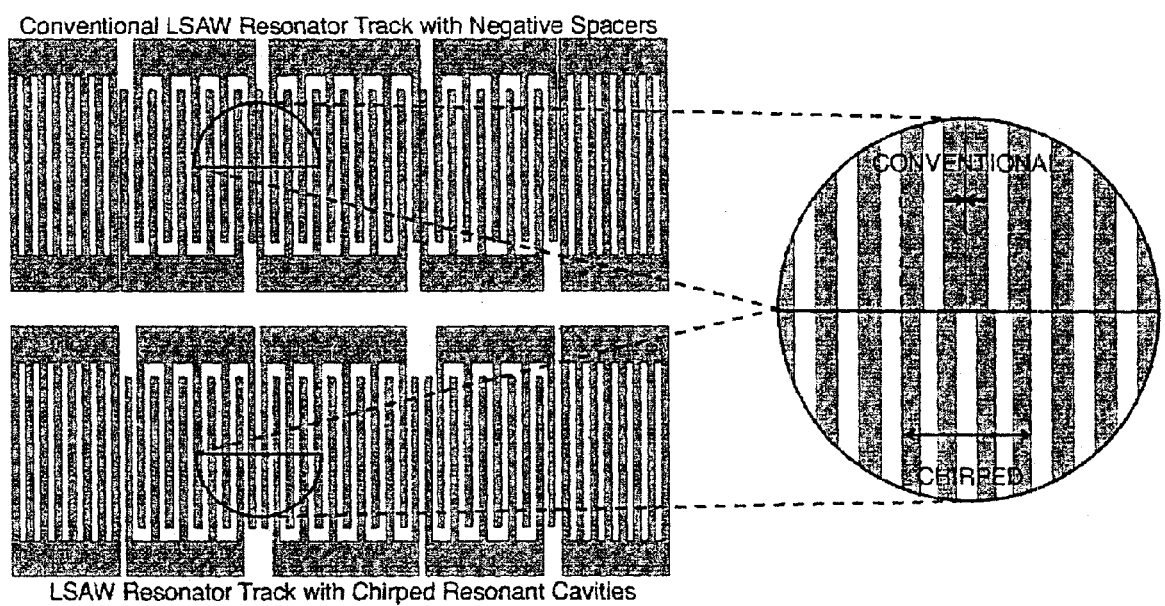
FIG. 9 illustrates the difference between a longitudinally coupled LSAW resonator filter with spacer-type resonant cavities of the prior art and a longitudinally coupled LSAW resonator filter with chirped resonant cavities of the present invention.

Between each IDT 4–6 and 9–11 of the longitudinally coupled LSAW resonator filters and the adjacent IDTs or spacers 2–12, resonant cavities are formed by chirping the fingers of the IDTs in proximity to the cavity, preferably the outer wavelength of each IDT. This phenomenon is illustrated with reference to FIG. 9 in contrast to the conventional spacer-type resonant cavities of the prior art. As illustrated, the phase discontinuity formed by the spacer of the prior art is eliminated by chirping the resonant cavity of the present invention.

Figure 3:
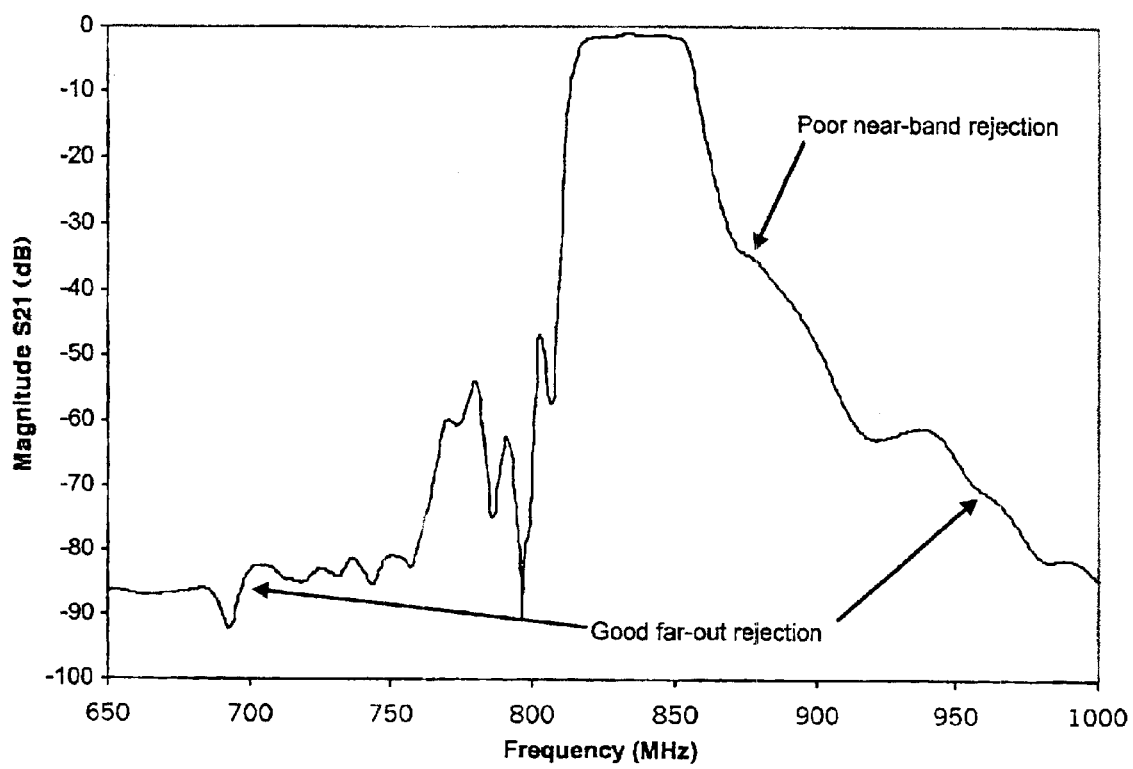
FIG. 3 is a plot of the frequency response of a conventional longitudinally coupled LSAW resonator filter.
Figure 4:
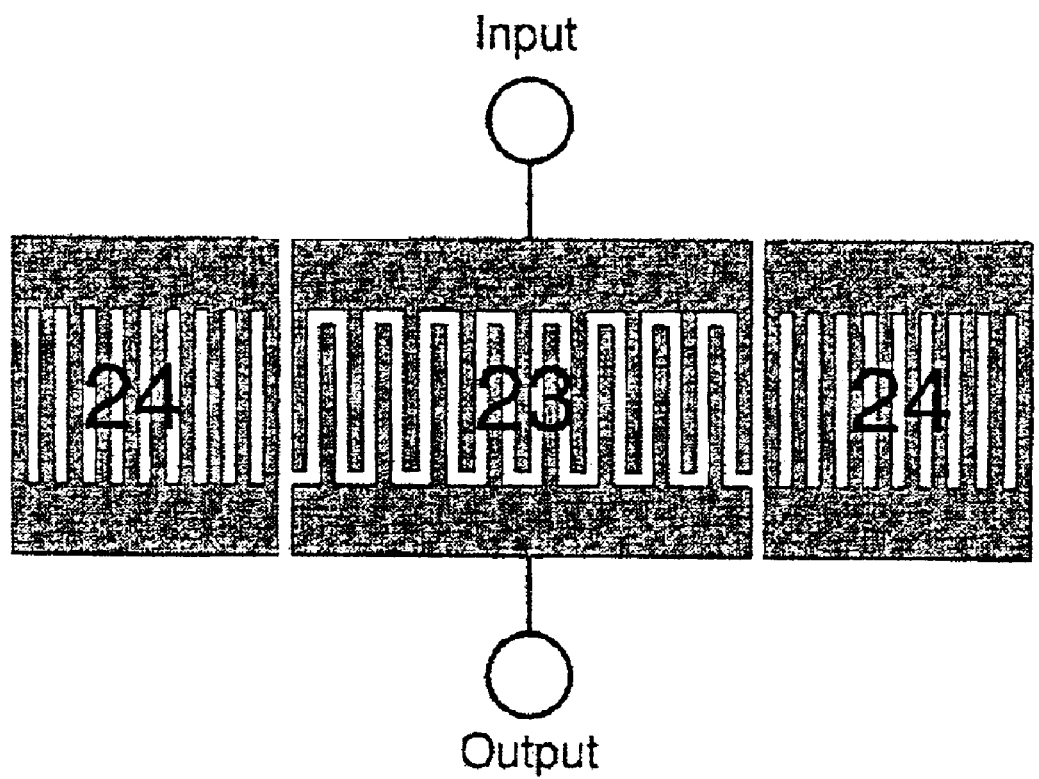
FIG. 4 is an illustration of a typical impedance element resonator.
Figure 5:
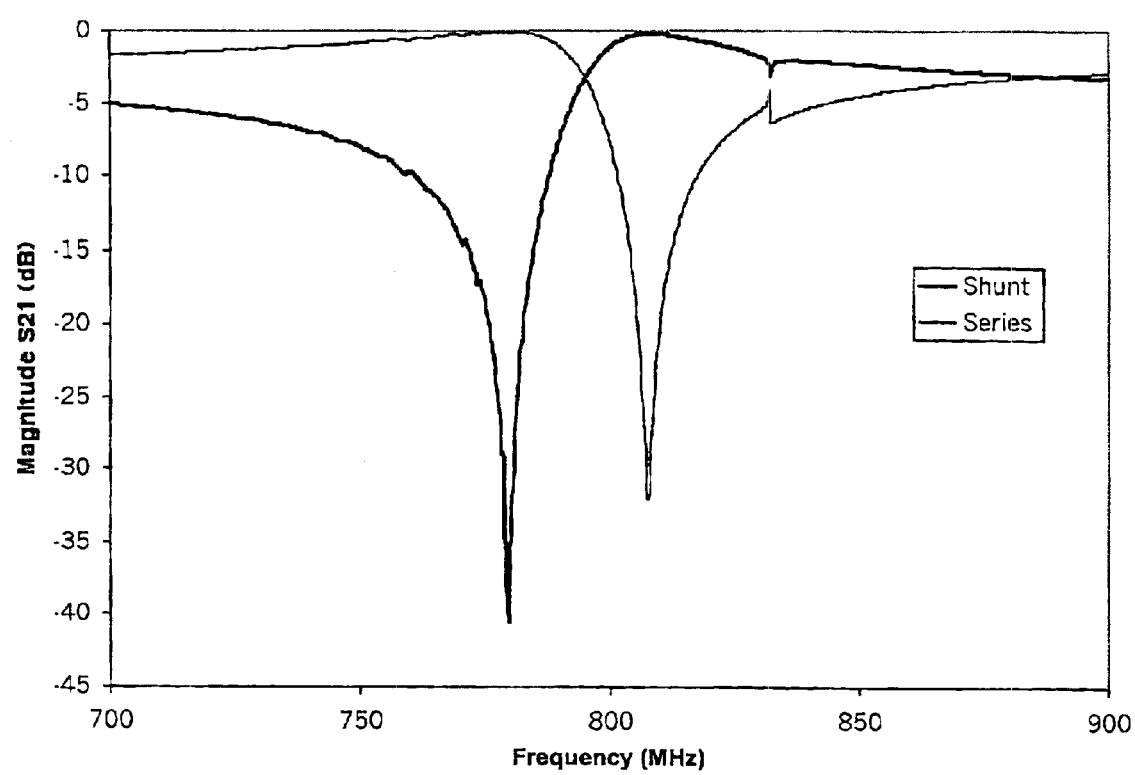
FIG. 5 is a plot of the frequency response of a typical impedance element resonator connected in series or shunt.
Figure 6A:
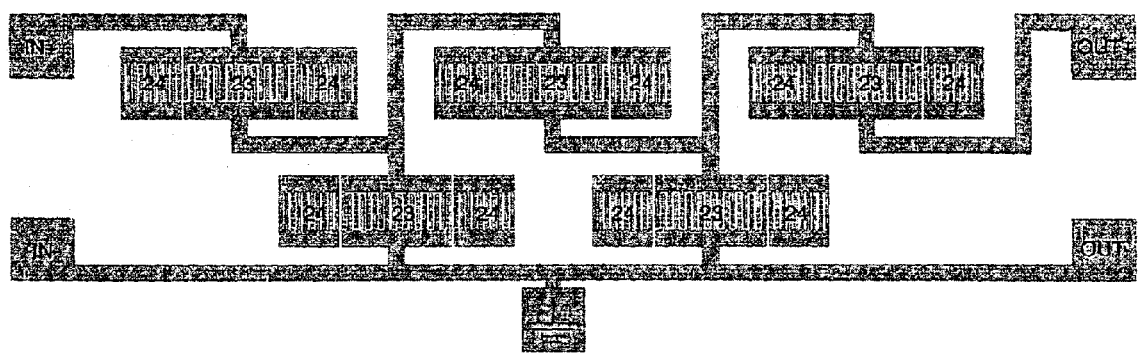
FIG. 6a and FIG. 6b are an illustration and a schematic, respectively, of a combination of impedance element resonators to form a ladder network.
Figure 6B:
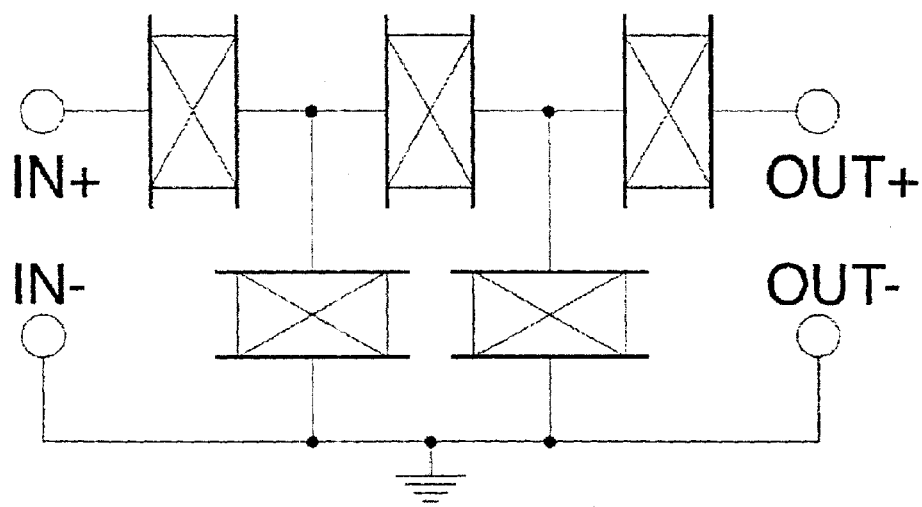
Figure 7:
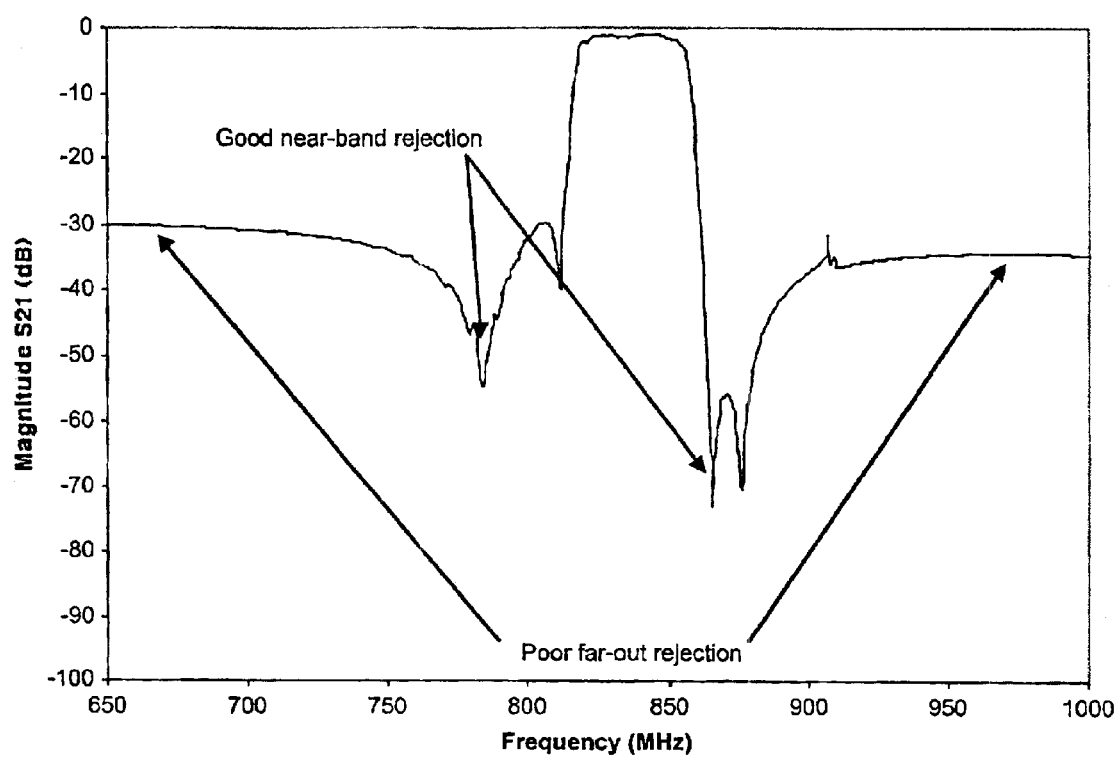
FIG. 7 is a plot of the frequency response of a typical ladder network.
Figure 8A:
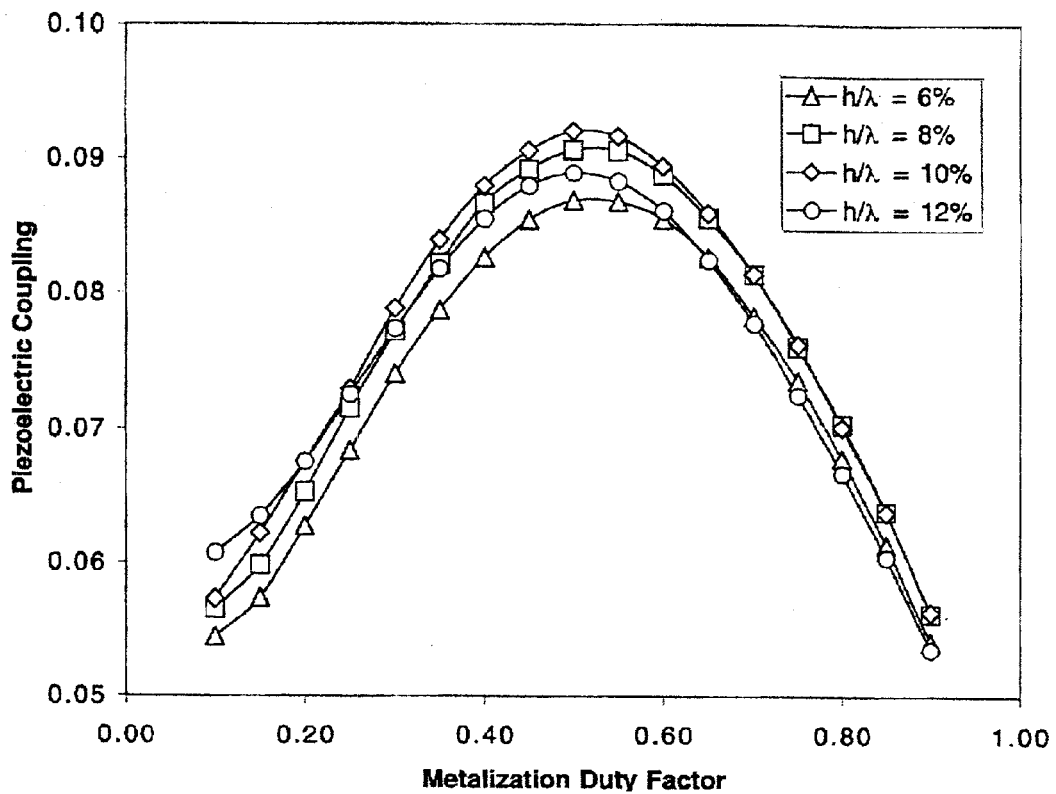
FIG. 8a and FIG. 8b show the variation of the piezoelectric coupling coefficient, $K^2$, and the reflectivity, $\kappa$, respectively, as a function of metalization ratio and relative thickness ($h/\lambda$) of aluminum metalization for IDTs and reflective gratings on 42° $LiTaO_3$.
Figure 8B:
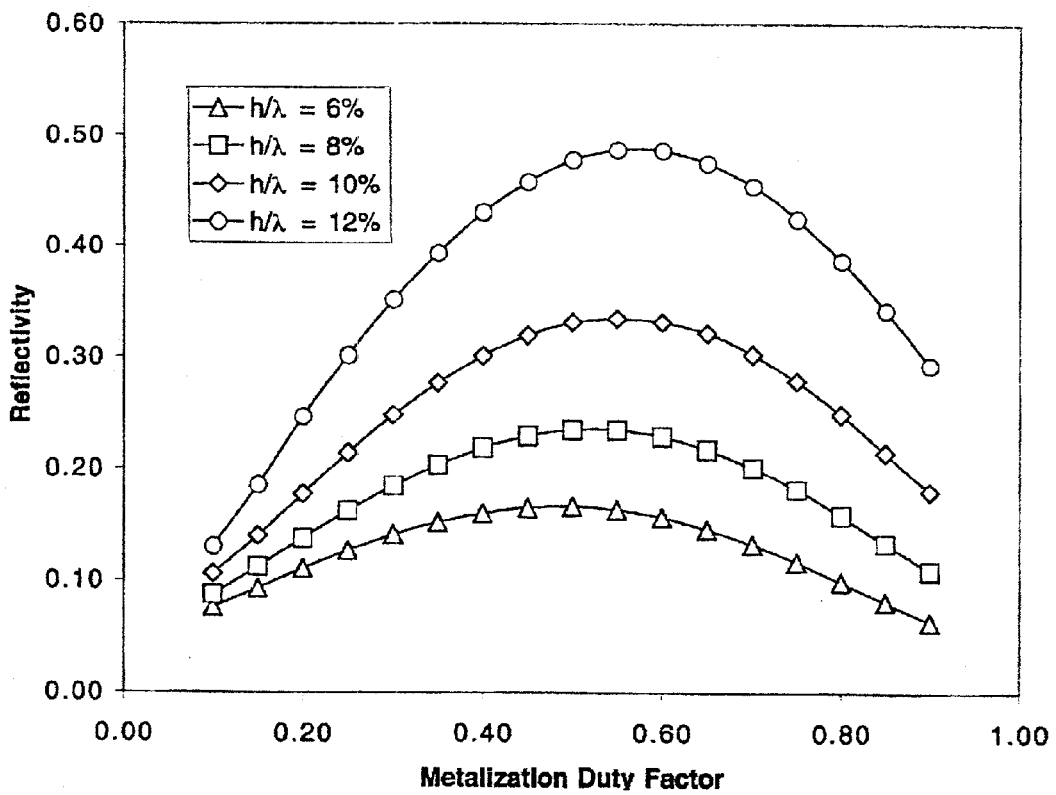
Figure 10:
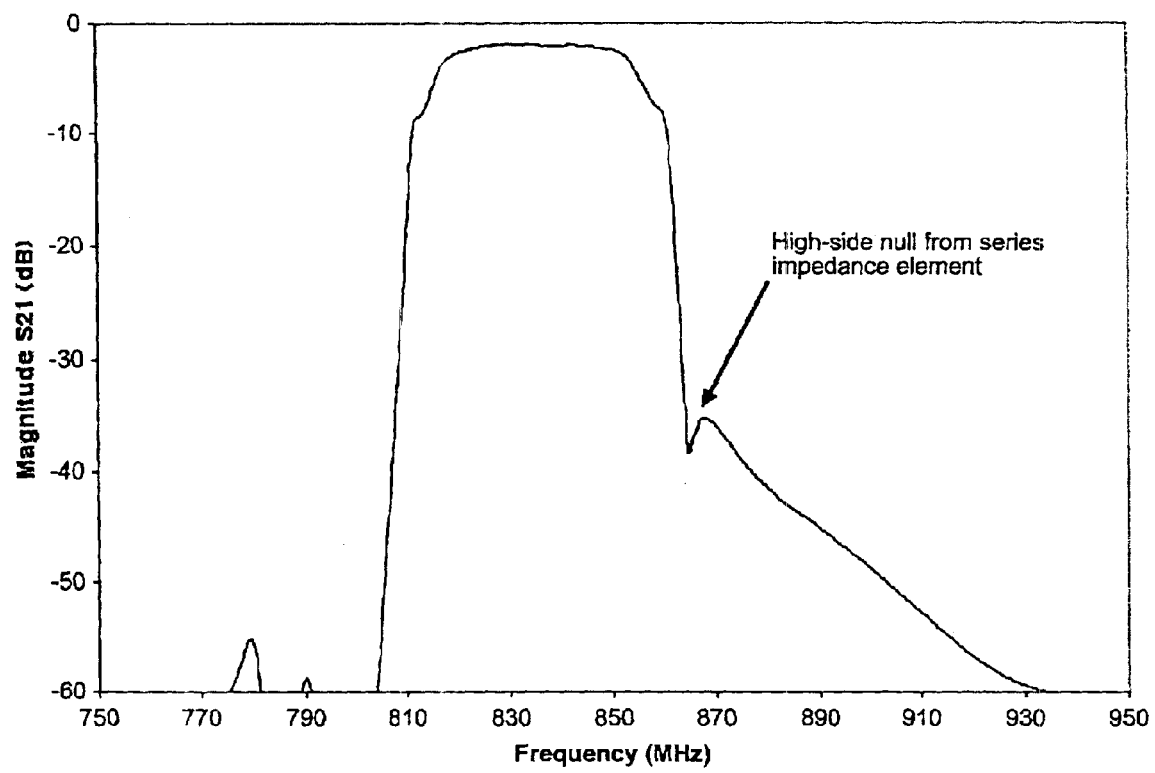
FIG. 10 is a plot of the transfer function of the first preferred embodiment of the present invention.

The transfer function of a filter designed in accordance with the FIG. 1 embodiment of the present invention is plotted in FIG. 10. The broadband shape of the response appears to be similar to that of a conventional longitudinally coupled LSAW resonator filter of the prior art, as shown in FIG. 3. However, the addition of the series impedance-element filters in the present invention results in a null in the frequency response just above the pass band. This dramatically improves the near-band rejection.

Figure 11:
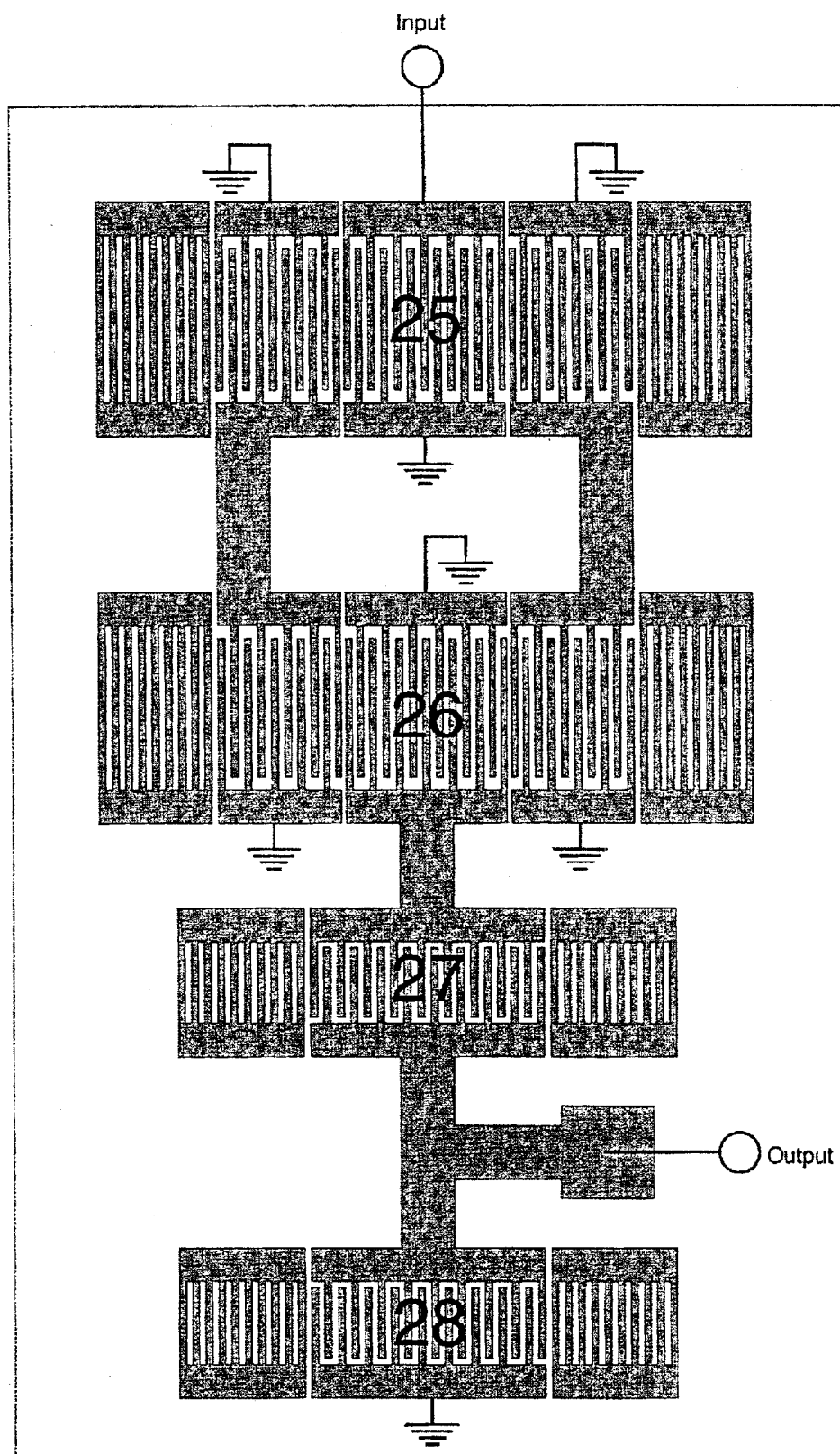
FIG. 11 is a schematic drawing of another preferred embodiment of the hybrid longitudinally coupled LSAW resonator filter of the present invention.

In a second preferred embodiment of the present invention, illustrated by way of example in FIG. 11, two tracks 25 and 26 of the longitudinally coupled LSAW resonator filter are connected directly in series. The electrical input 29 to the filter is connected to the input of the first track 25. The output of the second track 26 is connected in series with an impedance-element filter 27 to the electrical output connection 30. A second impedance-element filter 28 is connected in shunt with the output 30. This configuration is essentially a longitudinally coupled chirped LSAW resonator filter connected in series with a two-component (one series—one shunt) ladder network. As in the previous embodiment, a null can be realized in the frequency response just above the passband due to the series impedance-element filter. Additionally, in this second embodiment, the shunt impedance-element filter improves near-band rejection just below the passband. This can be used to cancel spurious modes that sometimes appear at frequencies below the pass-band or to generally improve near-in rejection on the low side of the pass-band.

By way of further example, the filter of a third preferred embodiment is configured such that both the input and output ports of the filter are electrically balanced and differential. This is as opposed to a single-ended connection whereby one terminal of the port is electrically connected to ground. In the balanced configuration, the two terminals are of opposite polarity, centered about the ground potential.

Figure 12:
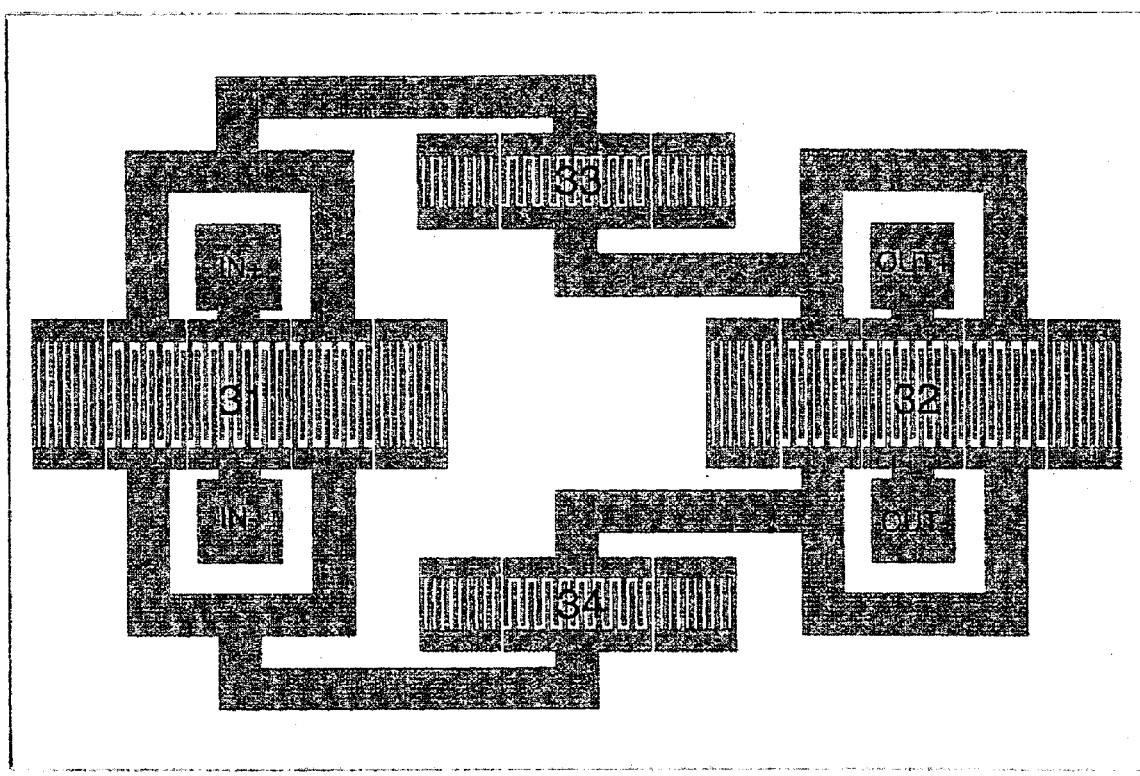
FIG. 12 is a schematic drawing of a third preferred embodiment of the hybrid longitudinally coupled LSAW resonator filter of the present invention.

As illustrated with reference to FIG. 12, the device of the third preferred embodiment consists of two longitudinally coupled chirped LSAW resonator tracks 31 and 32. The upper and lower bus bars of the output IDTs of the first track 31 are each connected in series with impedance-element filters 33 and 34 to the corresponding upper and lower bus bars of the input IDTs of the second track 32. Incorporating the impedance-element filters between the longitudinally coupled chirped LSAW resonator filter tracks allows more flexibility in the impedance characteristics of the device. Impedance-element filters operate best only over a relatively narrow range of impedances. Coupled resonator tracks, on the other hand, can be designed to match a much wider range of impedances. Since it is often desirable to design a bandpass filter with input and output impedances substantially different from that allowed by the impedance-element filters, the coupled resonator tracks on the input and output can be tailored to essentially transform the device input and output impedances to that required by the impedance-element filters. Furthermore, this scenario allows the possibility a filter with electrically balanced or differential inputs and outputs. Hence, a filter can be designed with virtually arbitrary input and output impedances, as well as balanced or differential operation, while still taking advantage of the near-in rejection characteristics of ladder filters.

It is to be understood that although the characteristics and advantages of the present invention have been set forth in the foregoing description of the preferred embodiments, the disclosure is illustrative only, and changes may be made by those skilled in the art within the scope of the appended claims.

What is claimed is:

1. A hybrid leaky surface acoustic wave resonator filter comprising:

a piezoelectric substrate suitable for propagation of a leaky surface acoustic wave;

a plurality of interdigital transducers disposed on the piezoelectric substrate along a longitudinal axis of surface acoustic wave propagation in a side by side manner between reflective elements so as to form one or more longitudinally coupled leaky surface acoustic wave resonator filter tracks having a plurality of resonant cavities disposed between adjacent interdigital transducers, wherein an electrode pitch of the interdigital transducer electrodes in the vicinity of the resonant cavity differs from the electrode pitch in a central portion of the interdigital transducers forming the resonant cavity, and wherein the interdigital transducers and reflective elements are comprised of metallic electrodes having a thickness in a range of 9% to 12% of a wavelength of the leaky surface acoustic wave; and at least one leaky surface acoustic wave impedance element filter including a single interdigital transducer disposed on the piezoelectric substrate between reflective gratings, wherein the single interdigital transducer is electrically connected to at least one of the plurality of interdigital transducers of the longitudinally coupled leaky surface acoustic wave resonator filter tracks.

2. A hybrid leaky surface acoustic wave resonator filter according to claim 1, wherein the electrode pitch in the vicinity of the resonant cavity is narrower than the electrode pitch in the central portion.

3. A hybrid leaky surface acoustic wave resonator filter according to claim 1 further comprising a metallic strip for connecting at least one of the leaky surface acoustic wave impedance element filters to at least one input or output of at least one of the longitudinally coupled leaky surface acoustic wave resonator filter tracks.

4. A hybrid leaky surface acoustic wave resonator filter according to claim 1, wherein the at least one leaky surface acoustic wave impedance element filter is electrically connected between at least one input or output of the filter and of at least one of the longitudinally coupled leaky surface acoustic wave resonator filter tracks.

5. A hybrid leaky surface acoustic wave resonator filter according to claim 1, wherein the at least one leaky surface acoustic wave impedance element filter is electrically connected between each of the longitudinally coupled leaky surface acoustic wave resonator filter tracks.

6. A hybrid leaky surface acoustic wave resonator filter according to claim 1, wherein the at least one leaky surface acoustic wave impedance element filter comprises a plurality of leaky surface acoustic wave impedance element filters electrically connected so as to form a ladder network.

7. A hybrid leaky surface acoustic wave resonator filter according to claim 1, wherein a plurality of longitudinally coupled leaky surface acoustic wave resonator filter tracks are connected in series with each other, as well as in series with at least one of the leaky surface acoustic wave impedance element filters.

8. A hybrid leaky surface acoustic wave resonator filter according to claim 1, wherein the line:space ratio of the electrodes within the interdigital transducers is within the range of 45:55 to 75:25.

9. A hybrid leaky surface acoustic wave resonator filter according to claim 1, wherein the interdigital transducers of one or more of the longitudinally coupled leaky surface acoustic wave resonator filters are configured so as to provide at least one electrical port with an impedance outside the range of approximately 35 to 75 ohms.

10. A hybrid leaky surface acoustic wave resonator filter according to claim 1, wherein the plurality of interdigital transducers and longitudinally coupled resonator tracks are configured such that at least one of the input and output ports is comprised of two terminals of substantially opposite phase, so as to allow the filter to be operated in differential or balanced mode.

11. A hybrid leaky surface acoustic wave resonator filter comprising:

a piezoelectric substrate formed from a lithium tantalite for propagation of a leaky surface acoustic wave;

a plurality of interdigital transducers disposed on the substrate along a longitudinal axis of surface acoustic wave propagation in a side by side manner between reflective elements so as to form one or more longitudinally coupled leaky surface acoustic wave resonator filter tracks having a plurality of resonant cavities disposed between adjacent interdigital transducers, wherein an electrode pitch of the interdigital transducer electrodes in the vicinity of the resonant cavity differs from the electrode pitch in a central portion of the interdigital transducers forming the resonant cavity, and wherein a reflectivity of the interdigital transducers forming the one or more longitudinally coupled leaky surface acoustic wave resonator filter tracks has a value ranging from 0.25 to 0.5; and at least one leaky surface acoustic wave impedance element filter including a single interdigital transducer disposed on the piezoelectric substrate between reflective gratings, wherein the single interdigital transducer is electrically connected to at least one of the plurality of interdigital transducers of the longitudinally coupled leaky surface acoustic wave resonator filter tracks.

12. A hybrid leaky surface acoustic wave resonator filter according to claim 11, wherein the interdigital transducers and reflective elements are comprises of metallic electrodes having a thickness in a range of 9% to 12% of a wavelength of the leaky surface acoustic wave.

13. A hybrid leaky surface acoustic wave resonator filter according to claim 11, wherein the line:space ratio of the electrodes within the interdigital transducers is within the range of 45:55 to 75:25.

14. A hybrid leaky surface acoustic wave resonator filter according to claim 11, wherein the interdigital transducers of one or more of the longitudinally coupled leaky surface acoustic wave resonator filters are configured so as to provide at least one electrical port with an impedance outside the range of approximately 35 to 75 ohms.

* * * * *

UNITED STATES PATENT AND TRADEMARK OFFICE
CERTIFICATE OF CORRECTION

PATENT NO. : 6,798,318 B1
DATED : September 28, 2004
INVENTOR(S) : Abbott et al.

It is certified that error appears in the above-identified patent and that said Letters Patent is hereby corrected as shown below:

Column 8,
Line 11, please delete "tantalite" and insert -- tantalate -- therefor.

Signed and Sealed this

Eleventh Day of January, 2005

JON W. DUDAS
*Director of the United States Patent and Trademark Office*